US008222674B2

(12) United States Patent
Ohachi et al.

(10) Patent No.: US 8,222,674 B2
(45) Date of Patent: Jul. 17, 2012

(54) SEMICONDUCTOR DEVICE HAVING A GROUP-III NITRIDE SUPERLATTICE LAYER ON A SILICON SUBSTRATE

(75) Inventors: Tadashi Ohachi, Kyotanabe (JP); Takashi Udagawa, Chichibu (JP)

(73) Assignees: Showa Denko K.K., Tokyo (JP); The Doshisha, Kyoto (JP)

( * ) Notice: Subject to any disclaimer, the term of this patent is extended or adjusted under 35 U.S.C. 154(b) by 0 days.

(21) Appl. No.: 13/236,384

(22) Filed: Sep. 19, 2011

(65) Prior Publication Data

US 2012/0007050 A1    Jan. 12, 2012

Related U.S. Application Data

(62) Division of application No. 12/063,002, filed as application No. PCT/JP2006/315978 on Aug. 7, 2006, now Pat. No. 8,043,977.

(30) Foreign Application Priority Data

Aug. 8, 2005  (JP) ................. 2005-229426

(51) Int. Cl.
*H01L 31/0328* (2006.01)
*H01L 31/0336* (2006.01)
*H01L 33/00* (2010.01)

(52) U.S. Cl. ...... 257/190; 257/94; 257/97; 257/E33.035

(58) Field of Classification Search .................. 257/94, 257/97, 103, 190, E33.028, E33.035
See application file for complete search history.

(56) References Cited

U.S. PATENT DOCUMENTS

| 5,563,428 | A | 10/1996 | Ek et al. |
| 5,667,586 | A | 9/1997 | Ek et al. |
| 5,679,152 | A | 10/1997 | Tischler et al. |
| 5,928,421 | A | 7/1999 | Yuri et al. |
| 6,462,355 | B1 | 10/2002 | Linthicum et al. |
| 6,602,764 | B2 | 8/2003 | Linthicum et al. |
| 6,717,185 | B2 * | 4/2004 | Edmond et al. .......... 257/97 |
| 6,849,881 | B1 | 2/2005 | Harle et al. |
| 7,014,710 | B2 | 3/2006 | Fang et al. |

(Continued)

FOREIGN PATENT DOCUMENTS

JP        55-3834        1/1980

(Continued)

OTHER PUBLICATIONS

Hiroo Yonezu, Ph.D.; "Photoemitter/Photorecptor Device"; Kougakutosho Co., Ltd.; Feb. 15, 1984.

(Continued)

*Primary Examiner* — Shouxiang Hu
(74) *Attorney, Agent, or Firm* — Sughrue Mion, PLLC

(57) ABSTRACT

Provided is a semiconductor device containing a silicon single crystal substrate 101, a silicon carbide layer 102 provided on a surface of the substrate, a Group III nitride semiconductor junction layer 103 provided in contact with the silicon carbide layer, and a superlattice-structured layer 104 constituted by Group III nitride semiconductors on the Group III nitride semiconductor junction layer. In this semiconductor device, the silicon carbide layer is a layer of a cubic system whose lattice constant exceeds 0.436 nm and is not more than 0.460 nm and which has a nonstoichiometric composition containing silicon abundantly in terms of composition, and the Group III nitride semiconductor junction layer has a composition of $Al_xGa_yIn_zN_{1-\alpha}M_\alpha$ ($0 \leq X, Y, Z \leq 1$, $X+Y+Z=1$, $0 \leq \alpha < 1$, M is a Group V element except nitrogen).

8 Claims, 2 Drawing Sheets

U.S. PATENT DOCUMENTS

| | | | |
|---|---|---|---|
| 7,253,451 B2 | 8/2007 | Yoo et al. | |
| 2002/0079502 A1* | 6/2002 | Ishibashi et al. | 257/89 |
| 2003/0010993 A1 | 1/2003 | Nakamura et al. | |
| 2004/0119067 A1* | 6/2004 | Weeks et al. | 257/40 |

FOREIGN PATENT DOCUMENTS

| | | |
|---|---|---|
| JP | 04-223330 A | 8/1992 |
| JP | 6-151963 | 5/1994 |
| JP | 6-151966 | 5/1994 |
| JP | 6-314659 | 11/1994 |
| JP | 6-326416 | 11/1994 |
| JP | 07-172997 A | 7/1995 |
| JP | 08-056015 A | 2/1996 |
| JP | 08-236445 A | 9/1996 |
| JP | 09-082643 A | 3/1997 |
| JP | 09-275226 A | 10/1997 |
| JP | 11-330622 A | 11/1999 |
| JP | 2000-068594 A | 3/2000 |
| JP | 2001-02632 A | 4/2001 |
| JP | 2002-299253 A | 10/2002 |
| JP | 2002-299254 A | 10/2002 |
| TW | 479374 B | 3/2002 |
| TW | 544952 B | 8/2003 |
| TW | 558843 B | 10/2003 |
| TW | 574762 B | 2/2004 |
| TW | 586136 B | 5/2004 |
| TW | 594880 B | 6/2004 |
| TW | 231321 B | 4/2005 |
| WO | 02/097904 A2 | 12/2002 |
| WO | 03/035945 A2 | 5/2003 |

OTHER PUBLICATIONS

Kimiyasu Saka; "Crystal Electronmicroscopy—For Material Researchers—"; Material Engineering Series; Uhcida Rokakuho Publishing Co., Ltd.; Nov. 25, 1997.

"Advanced Silicon Carbide Ceramics—Recent Development—"; Japan Society for the Promotion of Science; High Temperature Ceramic Material; 124th Committee; Uchida Rokakuho Publishing Co., Ltd.; Feb. 28, 2001.

M. Asif Khan, et al.; "Metal semiconductor field effect transistor based on single crystal GaN"; American Institute of Physics; Appl. Phys. Lett.; vol. 62, No. 15; Apr. 12, 1993; pp. 1786-1787.

T. Kikuchi et al.,; "3C-SiC/Si template growth and atomic layer epitaxy of cubic GaN by RF-MBE"; Journal of Crystal Growth 275 (2005) e1215-e1221.

Taiwanese Office Action dated Feb. 13, 2009 (3 pages).

B. Burkland et al.; "Effects of the Addition of Silane during Carbonization on the Epitaxy of 3C-SiC on Si"; Journal of the Electrochemical Society; 2002; vol. 149, No. 9; pp. G550-G554.

T. Kikuchi et al.; "3C-SiC/Si template growth and atomic layer epitaxy of cubic GaN by RF-MBE"; Journal of Crystal Growth; 275; Jan. 18, 2005; pp. e1215-e1221.

D. Wang et al.; "Heteroepitaxial growth of cubic GaN on Si(001) coated with thin flat SiC by plasma-assisted molecular-beam epitaxy"; Applied Physics Letters; vol. 76; No. 13; Mar. 27, 2000; pp. 1683-1685.

* cited by examiner

SEMICONDUCTOR DEVICE HAVING A GROUP-III NITRIDE SUPERLATTICE LAYER ON A SILICON SUBSTRATE

CROSS-REFERENCE RELATED APPLICATIONS

This application is a Rule 53(b) Divisional of U.S. patent application Ser. No. 12/063,002 filed Mar. 10, 2008, which is a 371 of PCT Application No. PCT/JP2006/315978 filed Aug. 7, 2006, which claims benefit to Japanese Patent Application No. 2005-229426 filed Aug. 8, 2005. The above-noted applications are incorporated herein by reference in their entirety.

TECHNICAL FIELD OF

The present invention relates to a semiconductor device formed from a stacked structure having a substrate of a silicon single crystal and a Group III nitride semiconductor layer.

BACKGROUND ART

Gallium nitride (GaN) and aluminum nitride (AlN) have (hitherto) been known as Group III nitride semiconductors. These Group III nitride semiconductor materials are used to form semiconductor light emitting devices, such as light emitting diodes (hereinafter abbreviated as "LEDs"), which emit blue, green or otherwise visible light of short wavelength, and laser diodes (hereinafter abbreviated as "LDs") (refer to, for example, JP-A SHO 55-3834 (Patent Document 1)). Also, these Group III nitride semiconductor materials are used to form electronic devices such as high-frequency transistors (refer to, for example, M. A. Kahn et al., Applied Physics Letters (Appl. Phys. Lett.), USA, 1993, Vol. 62, p. 1786 (Non-patent Document 1)).

In such semiconductor devices composed of Group III nitride semiconductor materials, a sapphire ($\alpha$-$Al_2O_3$) bulk single crystal (refer to, for example, JP-A HEI 6-151943 (Patent Document 2) or a cubic silicon carbide (SiC) bulk single crystal (refer to, for example, JP-A HEI 6-326416 (Patent Document 3)) is used as a substrate. LEDs have been manufactured by using, for example, a stacked structure having a cladding layer composed of a Group III nitride semiconductor material, and a light emitting layer and the like on a sapphire substrate (refer to, for example, JP-A HWI 6-151966 (Patent Document 4)).

However, because sapphire, which is used as a material for the substrate of a Group III nitride semiconductor device, has electrical insulating properties, the material has for example the problem that it is not easy to obtain Group III nitride LEDs having high breakdown voltage properties against static electricity and the like. However, because sapphire does not have high thermal conductivity, it has been difficult to fabricate field-effect transistors (hereinafter abbreviated as "FETs") of low loss in which the heat radiating properties of a substrate are utilized. If a silicon carbide bulk single crystal that has electrical conductivity and excellent thermal conductivity is used as a substrate, this is convenient for forming FETS having excellent breakdown voltage properties against static electricity and the like and FETs having excellent heat radiating properties. However, a silicon carbide bulk single crystal having a diameter that is appropriately large for use in a substrate is expensive and this is unfavorable for the manufacture of consumer Group III nitride semiconductor devices.

On the other hand, a silicon single crystal (hereinafter sometimes referred to as "silicon") inherently has high thermal conductivity and besides large-diameter single crystals having high electric conductivity have already been mass produced. Therefore, if silicon having high conductivity and a large diameter is used as a substrate, it is expected that, for example, inexpensive consumer LEDs having high breakdown voltage properties against static electricity and the like can be put into practical use. Furthermore, if silicon that has a high thermal conductivity in spite of high resistance is used in a substrate, it is expected that low-loss FETs for high-frequency band communication can be realized. However, the lattice constant (=a) of a silicon single crystal is 0.543 nm and the a-axis lattice constant of a Group III nitride semiconductor, for example, of hexagonal GaN is 0.319 nm. Therefore, a large lattice mismatch exists between the two materials. The mismatch is also large between cubic GaN (a=0.451 nm) and a silicon single crystal. For this reason, a silicon single crystal has the disadvantage that it is difficult to stably form a superior-quality Group III nitride semiconductor layer having few crystal defects on a silicon single crystal substrate.

It is according to conventional arts that in providing a Group III nitride semiconductor layer on a single crystal substrate having a large lattice mismatch, a buffer layer for reducing the lattice mismatch between the two is provided. In conventional arts, a buffer layer is formed from Group III nitride semiconductor materials of, for example, AlN and GaN (refer to, for example, JP-A HEI 6-314659 (Patent Document 5)). However, the mismatch between a silicon single crystal and cubic or hexagonal AlN or GaN is large, and lattice strains cannot be sufficiently relieved. For this reason, if a Group III nitride semiconductor layer is formed by using a buffer layer composed of a conventional Group III nitride semiconductor material, it is impossible to stably form a Group III nitride semiconductor layer excellent in crystallinity, thereby posing a problem.

Also, there has been known a conventional art that involves, in the formation of a Group III nitride semiconductor layer on a silicon single crystal as a substrate, forming a Group III nitride semiconductor layer via a thin film layer of cubic 3C-type silicon carbide (3C—SiC) (refer to, for example, T. Kikuchi et al., Journal of Crystal Growth (J. Crystal Growth), the Netherlands, 2005, Vol. 171, No. 1-2, page e1215 to page e1221 (Non-patent Document 2)). However, this technique has the disadvantage that depending on the properties of a 3C—SiC thin film layer, the crystallinity and the like of a Group III nitride semiconductor layer, which is an upper layer of the 3C—SiC thin film layer, change remarkably, with the result that it is impossible to stably form a superior Group III nitride semiconductor layer. Also, this technique poses the problem that even when a buffer layer composed of SiC is used, a Group III nitride semiconductor layer formed thereon cannot always be excellent in surface flatness.

Single crystals excellent in electrical conductivity and heat radiating properties have already been mass produced. In order to obtain a semiconductor device that is excellent in optical and electrical properties and uses a silicon single crystal as a substrate, it is necessary to use a buffer layer that is configured to advantageously reduce a lattice mismatch with a substrate and to be able to lead to the formation of a good-quality Group III nitride semiconductor layer. For example, even when an SiC layer is used as a buffer layer in forming a Group III nitride semiconductor layer on a silicon single crystal substrate, it is necessary to use an SiC buffer layer that is configured to be able to advantageously reduce a lattice mismatch between the two materials.

Furthermore, in addition to the use of an SiC buffer layer that is configured to be effective in reducing a lattice mismatch, it is necessary to produce an original idea in a stacked structure above the buffer layer that leads to the formation of a good-quality Group III nitride semiconductor layer excellent in surface flatness as well as in crystallinity. Also, in order to manufacture a semiconductor device having excellent properties, it is necessary to use a manufacturing method for leading to stably forming the SiC buffer layer and the good-quality Group III nitride semiconductor layer excellent in surface flatness.

The object of the present invention is to provide a semiconductor device having a buffer layer capable of advantageously reducing a lattice mismatch with a substrate.

Another object of the present invention is to provide a high-performance semiconductor device that leads to the formation of a good-quality Group III nitride semiconductor layer excellent in crystallinity and surface flatness.

Still another object of the present invention is to provide a method of manufacturing a semiconductor device capable of stably fabricating an SiC buffer layer that effectively reduces a lattice mismatch and a superior-quality Group III nitride semiconductor layer excellent in surface flatness.

DISCLOSURE OF THE INVENTION

To achieve the above-described objects, in a semiconductor device comprising a silicon single crystal substrate, a silicon carbide (SIC) layer provided on a surface of the substrate, a Group III nitride semiconductor junction layer provided in contact with the silicon carbide layer, and a superlattice-structured layer constituted by Group III nitride semiconductors on the Group III nitride semiconductor junction layer, the semiconductor device of the present invention is characterized by (1) using a silicon single crystal as a substrate and comprising a silicon carbide layer, which is provided on the substrate and composed of cubic silicon carbide whose lattice constant exceeds 0.436 nm and is not more than 0.460 nm, and which has a nonstoichiometric composition containing silicon abundantly in terms of composition, a Group III nitride semiconductor junction layer having a composition of $Al_xGa_yIn_zN_{1-\alpha}M_\alpha$ ($0 \leq X, Y, Z \leq 1$, $X+Y+Z=1$, the symbol M denotes a Group V element except nitrogen and $0 \leq \alpha < 1$), which is provided on the silicon carbide layer, and a superlattice-structured layer constituted by Group III nitride semiconductors, which is provided on the Group III nitride semiconductor junction layer.

Particularly, the semiconductor device related to the present invention is characterized in that (2) in the semiconductor device described in item (1) above, the superlattice-structured layer provided on the Group III nitride semiconductor junction layer is formed by alternately stacking aluminum-gallium nitride (composition formula: $Al_xGa_{1-x}N$: $0 \leq X \leq 1$) layers having different aluminum (Al) composition ratios.

Particularly, the semiconductor device related to the present invention is characterized in that (3) in the semiconductor device described in item (2) above, a layer having a lower Al composition ratio (=X) among the aluminum gallium nitride ($Al_xGa_{1-x}N$: $0 \leq X \leq 1$) layers constituting the superlattice-structured layer is provided so as to be bonded to the Group III nitride semiconductor junction layer.

Particularly, the semiconductor device related to the present invention is characterized in that (4) in the semiconductor device described in item (1) above, the superlattice-structured layer is formed by alternately stacking gallium-indium nitride (composition formula: $Ga_QIn_{1-Q}N$: $0 \leq Q \leq 1$) layers having different gallium (Ga) composition ratios.

Particularly, the semiconductor device related to the present invention is characterized in that (5) in the semiconductor device described in item (4) above, a layer having a larger gallium composition ratio (=Q) among the gallium-indium nitride ($Ga_QIn_{1-Q}N$: $0 \leq Q \leq 1$) layers constituting the superlattice-structured layer is provided so as to be bonded to the Group III nitride semiconductor junction layer.

Particularly, the semiconductor device related to the present invention is characterized in that (6) in the semiconductor device described in any one of items (1) to (5) above, the Group III nitride semiconductor superlattice-structured layer is constituted by Group III nitride semiconductor layers having a film thickness from 5 monolayers (MLs) to 30 MLs.

Particularly, the semiconductor device related to the present invention is characterized in that (7) in the semiconductor device described in any one of items (1) to (6) above, the substrate is a (111) silicon single crystal whose surface is a (111) crystal plane, and in that the Group III nitride semiconductor junction layer is composed of hexagonal wurtzite crystal type aluminum nitride (AlN).

Particularly, the semiconductor device related to the present invention is characterized in that (8) in the semiconductor device described in any one of items (1) to (6) above, the substrate is a (001) silicon single crystal whose surface is a (001) crystal plane, and in that the Group III nitride semiconductor junction layer is composed of cubic zinc blende crystal type aluminum nitride (AlN).

Also, in a method of manufacturing a semiconductor device comprising a substrate composed of a silicon single crystal, a silicon carbide layer provided on a surface of the silicon single crystal substrate, a Group III nitride semiconductor junction layer provided so as to be bonded to the silicon carbide layer, and a superlattice-structured layer constituted by Group III semiconductors, which is provided on the Group III nitride semiconductor junction layer, the method of manufacturing a semiconductor device of the present invention is characterized by (A) including the steps of: (1) blowing a hydrocarbon gas onto a surface of a silicon single crystal substrate and thereby causing hydrocarbon to be adsorbed onto a crystal plane that is the surface of the substrate; (2) thereafter heating the silicon single crystal substrate to a temperature of not less than a temperature at which the hydrocarbon is adsorbed, thereby forming, on the surface of the silicon single crystal substrate, a cubic silicon carbide layer whose lattice constant exceeds 0.436 nm and is not more than 0.460 nm and which has a nonstoichiometric composition containing silicon abundantly in terms of composition; (3) thereafter supplying a gas containing a Group V element and a gas containing Group III element to the surface of the silicon carbide layer and thereby forming a Group III nitride semiconductor junction layer; and (4) thereafter forming a superlattice-structured layer constituted by Group III nitride semiconductors on the Group III nitride semiconductor junction layer.

Particularly, the method of manufacturing a semiconductor device of the present invention is characterized by (B) involving, in the manufacturing method described in item (A) above, using a (111) silicon single crystal whose surface is a (111) crystal plane as the substrate, forming, on the surface of the substrate, a cubic silicon carbide layer which has a nonstoichiometric composition containing silicon abundantly in terms of composition and whose surface is a (111) crystal plane silicon carbide layer, thereafter forming a hexagonal Group III nitride semiconductor junction layer on the surface of the silicon carbide layer, and thereafter forming a superlattice-structured layer constituted by hexagonal Group III nitride semiconductors on the surface of the Group III nitride semiconductor junction layer.

Particularly, the method of manufacturing a semiconductor device of the present invention is characterized by (C) involving, in the manufacturing method described in item (A) above, using a (001) silicon single crystal whose surface is a (001) crystal plane as the substrate, forming, on the surface of the substrate, a cubic silicon carbide layer which has a nonstoichiometric composition containing silicon abundantly in terms of composition and whose surface is a (001) crystal plane silicon carbide layer, thereafter forming a cubic Group III nitride semiconductor junction layer on the surface of the silicon carbide layer, and thereafter forming a superlattice-structured layer constituted by cubic Group III nitride semiconductors on the surface of the Group III nitride semiconductor junction layer.

Particularly, the method of manufacturing a semiconductor device of the present invention is characterized by (D) involving, in the manufacturing method described in item (B) or (C) above, forming a silicon carbide layer which has a nonstoichiometric composition containing silicon abundantly in terms of composition on the surface of the substrate formed from a silicon single crystal, and thereafter forming a Group III nitride semiconductor junction layer composed of aluminum nitride by supplying a gaseous raw material containing aluminum and a gaseous raw material containing nitrogen to the surface of the silicon carbide.

Particularly, the method of manufacturing a semiconductor device of the present invention is characterized by (E) involving, in the manufacturing method described in item (D) above, forming a silicon carbide layer which has a nonstoichiometric composition containing silicon abundantly in terms of composition on the surface of the substrate composed of a silicon single crystal, thereafter causing an aluminum film to be deposited on the surface of the silicon carbide layer by supplying a gaseous raw material containing aluminum, thereafter nitriding the aluminum film by supplying a gaseous raw material containing nitrogen, and forming an aluminum nitride layer.

Particularly, the method of manufacturing a semiconductor device of the present invention is characterized by (F) involving, in the manufacturing method described in item (D) above, blowing a hydrocarbon gas to the surface of the substrate composed of a silicon single crystal and causing the hydrocarbon to be adsorbed onto the surface of the silicon single crystal substrate while radiating electrons.

Particularly, the method of manufacturing a semiconductor device of the present invention is characterized by (G) involving, in the manufacturing method described in item (F) above, after causing hydrocarbon to be adsorbed onto the surface of the substrate composed of a silicon single crystal, heating the silicon single crystal substrate while radiating electrons to a temperature of not less than a temperature at which the hydrocarbon is caused to be adsorbed, thereby forming, on the surface of the silicon single crystal substrate, a cubic silicon carbide layer whose lattice constant exceeds 0.436 nm and is not more than 0.460 nm and which has a nonstoichiometric composition containing silicon abundantly in terms of composition.

That is, the present invention relates to the following:

[1] A semiconductor device comprising a silicon single crystal substrate, a silicon carbide layer provided on a surface of the substrate, a Group III nitride semiconductor junction layer provided in contact with the silicon carbide layer, and a superlattice-structured layer constituted by Group III nitride semiconductors on the Group III nitride semiconductor junction layer, which is characterized in that the silicon carbide layer is a layer of a cubic system whose lattice constant exceeds 0.436 nm and is not more than 0.460 nm and which has a nonstoichiometric composition containing silicon abundantly in terms of composition, and in that the Group III nitride semiconductor junction layer has a composition of $Al_xGa_yIn_zN_{1-\alpha}M_\alpha$ ($0 \leq X, Y, Z \leq 1$, $X+Y+Z=1$, $0 \leq \alpha < 1$, M is a Group V element except nitrogen).

[2] The semiconductor device described in item [1] above, which is characterized in that the superlattice-structured layer constituted by Group III nitride semiconductors is a layer formed by alternately stacking aluminum-gallium nitride ($Al_xGa_{1-x}N$: $0 \leq X \leq 1$) layers having different aluminum (Al) composition ratios.

[3] The semiconductor device described in item [2] above, which is characterized in that a layer having a low Al composition ratio among the aluminum-gallium nitride layers having different aluminum composition ratios is in contact with the Group III nitride semiconductor junction layer.

[4] The semiconductor device described in item [1] above, which is characterized in that the superlattice-structured layer constituted by Group III nitride semiconductors is a layer formed by alternately stacking gallium-indium nitride ($Ga_QIn_{1-Q}N$: $0 \leq Q \leq 1$) layers having different gallium (Ga) composition ratios.

[5] The semiconductor device described in item [4] above, which is characterized in that a layer having a high gallium (Ga) composition ratio among the gallium-indium nitride layers having different gallium (Ga) composition ratios is in contact with the Group III nitride semiconductor junction layer.

[6] The semiconductor device described in any one of items [1] to [5] above, which is characterized in that the superlattice-structured layer constituted by Group III nitride semiconductors has a film thickness of 5 monolayers (MLs) to 30 MLs.

[7] The semiconductor device described in any one of items [1] to [6] above, which is characterized in that the silicon single crystal substrate is a substrate whose surface is a (111) crystal plane, and in that the Group III nitride semiconductor junction layer is a hexagonal wurtzite crystal type aluminum nitride (AlN) layer.

[8] The semiconductor device described in any one of items [1] to [6] above, which is characterized in that the silicon single crystal substrate is a substrate whose surface is a (001) crystal plane, and in that the Group III nitride semiconductor junction layer is a cubic zinc blende crystal type aluminum nitride (AlN) layer.

[9] A method of manufacturing a semiconductor device that is characterized by including in this order: (1) the step of blowing a hydrocarbon gas onto a surface of a silicon single crystal substrate and causing the hydrocarbon to be adsorbed onto the surface of the substrate; (2) the step of heating the silicon single crystal substrate to a temperature of not less than a temperature at which the hydrocarbon is caused to be adsorbed, thereby forming, on the surface of the silicon single crystal substrate, a cubic silicon carbide layer whose lattice constant exceeds 0.436 nm and is not more than 0.460 nm and which has a nonstoichiometric composition containing silicon abundantly in terms of composition; (3) the step of supplying a gas containing a Group V element and a gas containing Group III element to the surface of the silicon carbide layer, thereby forming a Group III nitride semiconductor junction layer; and (4) the step of forming a superlattice-structured layer constituted by Group III nitride semiconductors on the Group III nitride semiconductor junction layer.

[10] The method of manufacturing a semiconductor device described in item [9] above, which is characterized in that the silicon single crystal substrate is a substrate whose surface is a (111) crystal plane, in that the silicon carbide layer formed on the substrate surface is a layer whose surface is a (111) crystal plane, in that the Group III nitride semiconductor junction layer is a hexagonal layer, and in that the superlattice-structured layer constituted by Group III nitride semiconductors is a hexagonal layer.

[11] The method of manufacturing a semiconductor device described in item [9] above, which is characterized in that the silicon single crystal substrate is a substrate whose surface is a (001) crystal plane, in that the silicon carbide layer formed on the substrate surface is a layer whose surface is a (001) crystal plane, in that the Group III nitride semiconductor junction layer is a cubic layer, and in that the superlattice-structured layer constituted by Group III nitride semiconductors is a cubic layer.

[12] The method of manufacturing a semiconductor device described in any one of items [9] to [11] above, which is characterized in that in the step (3), a Group III nitride semiconductor junction layer is formed by supplying a raw material containing aluminum as a gas containing a Group III element and a raw material containing nitrogen as a gas containing a Group V element.

[13] The method of manufacturing a semiconductor device described in any one of items [9] to [12] above, which is characterized in that the step (3) comprises: (3a) forming a layer containing a Group III element by supplying a gas containing a Group III element to the surface of the silicon carbide layer; and (3b) forming a nitride layer of a Group III element as the Group III nitride semiconductor junction layer by nitriding a layer containing a Group III element.

[14] The method of manufacturing a semiconductor device described in item [13] above, which is characterized in that in the step (3a), an aluminum layer is formed by supplying a gas containing aluminum to the surface of the silicon carbide surface as a gas containing a Group III element.

[15] The method of manufacturing a semiconductor device described in any one of items [9] to [14] above, which is characterized in that the step (1) comprises the step (1a) that involves blowing a hydrocarbon gas onto the surface of the silicon single crystal substrate and causing the hydrocarbon to be adsorbed onto the surface of the substrate by radiating electrons.

[16] The method of manufacturing a semiconductor device described in any one of items [9] to [14] above, which is characterized in that the steps (1) and (2) comprise the step (1b) that involves, after causing hydrocarbon to be adsorbed onto the surface of the silicon single crystal substrate, heating the silicon single crystal substrate while radiating electrons to a temperature of not less than a temperature at which the hydrocarbon is caused to be adsorbed, thereby forming, on the surface of the silicon single crystal substrate, a cubic silicon carbide layer whose lattice constant exceeds 0.436 nm and is not more than 0.460 nm and which has a nonstoichiometric composition containing silicon abundantly in terms of composition.

According to the present invention, in a semiconductor device comprising a substrate composed of a silicon single crystal, a silicon carbide layer provided on a surface of the substrate, a Group III nitride semiconductor junction layer provided so as to be bonded to the silicon carbide layer, and a superlattice-structured layer constituted by Group III nitride semiconductors on the Group III nitride semiconductor junction layer, the semiconductor device of the present invention is such that a silicon single crystal is used as the substrate, a buffer layer is composed of cubic silicon carbide, which is provided on the substrate, whose lattice constant exceeds 0.436 nm and is not more than 0.460 nm and which has a nonstoichiometric composition containing silicon abundantly in terms of composition, a Group III nitride semiconductor junction layer having a composition of $Al_xGa_yIn_zN_{1-\alpha}M_\alpha$ ($0 \leq X, Y, Z \leq 1$, $X+Y+Z=1$, the symbol M denotes a Group V element except nitrogen (N) and $0 \leq \alpha < 1$), is provided on the silicon carbide layer, and a superlattice-structured layer constituted by Group III nitride semiconductors is further provided on the Group III nitride semiconductor junction layer, whereby a stacked structure is formed. And the semiconductor device is obtained by using the stacked structure. Accordingly, it is possible to form a good-quality Group III nitride semiconductor layer excellent in crystallinity and surface flatness and, therefore, it is possible to provide a high-performance semiconductor device.

Particularly, in the present invention, the superlattice-structured layer provided on the Group III nitride semiconductor junction layer is formed by alternately stacking $Al_xGa_{1-x}N$ ($0 \leq X \leq 1$) layers having different aluminum composition ratios. Accordingly, it is possible to stably form a good-quality Group III nitride semiconductor layer excellent in crystallinity and surface flatness and, therefore, this is effective in stably providing a high-performance semiconductor device.

Particularly, also in the present invention, in providing the superlattice-structured layer constituted by $Al_xGa_{1-x}N$ ($0 \leq X \leq 1$) layers having different aluminum contents, the stacked structure is such that a layer having a lower Al composition ratio (=X) among the $Al_xGa_{1-x}N$ ($0 \leq X \leq 1$) layers constituting the superlattice structure is provided so as to be bonded to the Group III nitride semiconductor junction layer. Therefore, particularly, it is possible to form a Group III nitride semiconductor layer excellent in surface flatness and this can contribute to obtaining a high-performance semiconductor device.

Particularly, also in the present invention, the superlattice-structured layer provided on the Group III nitride semiconductor junction layer is formed by alternately stacking ($Ga_QIn_{1-Q}N$: ($0 \leq Q \leq 1$)) layers having different gallium (Ga) composition ratios. Accordingly, it is possible to stably form a good-quality Group III nitride semiconductor layer excellent in crystallinity and surface flatness and, therefore, this is effective in stably providing a high-performance semiconductor device.

Particularly, also in the present invention, in providing the superlattice-structured layer constituted by $Ga_QIn_{1-Q}N$ ($0 \leq Q \leq 1$) layers, a gallium-indium nitride layer having a higher gallium (Ga) composition ratio (=Q) among the $Ga_QIn_{1-Q}N$ ($0 \leq Q \leq 1$) layers constituting the superlattice-structured layer is provided so as to be bonded to the Group III nitride semiconductor junction layer. Therefore, particularly, it is possible to form a Group III nitride semiconductor layer excellent in surface flatness and this can contribute to obtaining a high-performance semiconductor device.

Particularly, in the present invention, the superlattice-structured layer is constituted by $Al_xGa_{1-x}N$ ($0 \leq X \leq 1$) layers or $Ga_QIn_{1-Q}N$ ($0 \leq Q \leq 1$) layers having film thicknesses of 5 MLs to 30 MLs. Therefore, particularly, it is possible to form a Group III nitride semiconductor layer excellent in surface flatness and this can contribute to stably obtaining a high-performance semiconductor device.

Particularly, in the present invention, a (111) silicon single crystal is used as the substrate and the Group III nitride semiconductor junction layer provided on the surface of the semiconductor via an SiC buffer layer is formed from a wurtzite crystal type $Al_xGa_yIn_zN_{1-\alpha}M_\alpha$ ($0 \leq X, Y, Z \leq 1$, $X+Y+Z=1$, the symbol M denotes a Group V element except nitrogen (N) and $0 \leq \alpha < 1$). Therefore, the superlattice-structured layer and the like provided on the Group III nitride semiconductor junction layer can be formed in a unified manner from the hexagonal Group III nitride semiconductor layer.

Accordingly, this is advantageous for obtaining a semiconductor device capable of exhibiting the properties based on hexagonal Group III nitride semiconductor materials.

Particularly, in the present invention, a (001) silicon single crystal whose surface is a (001) crystal plane is used as the substrate, and the Group III nitride semiconductor junction layer provided on the surface of the substrate via an SiC buffer layer is formed from a cubic zincblende crystal type $Al_xGa_yIn_zN_{1-\alpha}M_\alpha$ ($0 \leq X, Y, Z \leq 1$, $X+Y+Z=1$, the symbol M denotes a Group V element except nitrogen (N), and $0 \leq \alpha < 1$). Therefore, the superlattice-structured layer and the like provided on the Group III nitride semiconductor junction layer can be formed in a unified manner from the cubic Group III nitride semiconductor layer. Accordingly, this is advantageous for obtaining a semiconductor device capable of exhibiting the properties based on cubic Group III nitride semiconductor materials.

Also, in the present invention, in manufacturing a semiconductor device comprising a substrate composed of a silicon single crystal, a silicon carbide layer provided on a surface of the silicon single crystal substrate, a Group III nitride semiconductor junction layer provided so as to be bonded to the silicon carbide layer, and a superlattice-structured layer constituted by Group III semiconductors, which is provided on the Group III nitride semiconductor junction layer, a hydrocarbon gas is blown onto a surface of a silicon single crystal substrate and the hydrocarbon is caused to be adsorbed onto a crystal plane that is the surface of the substrate. And thereafter the silicon single crystal substrate is heated to a temperature of not less than a temperature at which the hydrocarbon is caused to be adsorbed, whereby the silicon carbide layer is formed. Therefore, it is possible to positively form, on the surface of the silicon single crystal substrate, a cubic silicon carbide layer whose lattice constant exceeds 0.436 nm and is not more than 0.460 nm and which has a nonstoichiometric composition containing silicon abundantly in terms of composition. And hence it is possible to obtain a Group III nitride semiconductor junction layer composed of good-quality $Al_xGa_yIn_zN_{1-\alpha}M_\alpha$ ($0 \leq X, Y, Z \leq 1$, $X+Y+Z=1$, the symbol M represents a Group V element except nitrogen (N) and $0 \leq \alpha < 1$), which is provided on the silicon carbide layer, and a superlattice-structured layer constituted by Group III nitride semiconductors, which is further provided on the Group III nitride semiconductor junction layer. Therefore, it is possible to manufacture a semiconductor device having excellent properties, which reflect the excellent crystallinity of these semiconductor layers.

Particularly, according to the present invention, a (111) silicon single crystal whose surface is a (111) crystal plane is used as the substrate, a cubic (111) silicon carbide layer which has a nonstoichiometric composition containing silicon abundantly in terms of composition and whose surface is a (111) crystal plane is formed on the surface of the substrate, a Group III nitride semiconductor junction layer composed of hexagonal $Al_xGa_yIn_zN_{1-\alpha}M_\alpha$ ($0 \leq X, Y, Z \leq 1$, $X+Y+Z=1$, the symbol M denotes a Group V element except nitrogen and $0 \leq \alpha < 1$) is formed on the surface of the silicon carbide layer, thereafter a superlattice-structured layer constituted by hexagonal Group III nitride semiconductors is formed, whereby a semiconductor device is formed through these steps. Therefore, it is possible to manufacture a semiconductor device capable of advantageously exhibiting optical or electrical properties based on the crystal properties of the hexagonal Group III nitride semiconductor.

Particularly, according to the present invention, a (001) silicon single crystal whose surface is a (001) crystal plane is used as the substrate, a cubic silicon carbide layer which has a nonstoichiometric composition containing silicon abundantly in terms of composition and whose surface is a (001) crystal plane is formed on the surface of the substrate, a cubic Group III nitride semiconductor junction layer is formed on the surface of the silicon carbide layer, thereafter a superlattice-structured layer constituted by cubic Group III nitride semiconductor junction layers is formed on the Group III nitride semiconductor junction layer, whereby a semiconductor device is formed through these steps. Therefore, it is possible to manufacture a semiconductor device capable of advantageously exhibiting optical or electrical properties based on the crystal properties of the cubic Group III nitride semiconductor.

Particularly, according to the present invention, after the formation of a silicon carbide layer which has a nonstoichiometric composition containing silicon abundantly in terms of composition on the surface of the substrate, a Group III nitride semiconductor junction layer composed of aluminum nitride is formed by supplying a gaseous raw material containing aluminum and a gaseous raw material containing nitrogen to the surface of the silicon carbide layer. Accordingly, it is possible to reduce a lattice mismatch and, therefore, it is possible to manufacture a high-performance semiconductor device having a good-quality Group III nitride semiconductor junction layer composed of AlN.

Particularly, according to the present invention, when after the formation of a silicon carbide layer which has a nonstoichiometric composition containing silicon abundantly in terms of composition on the surface of the substrate, a Group III nitride semiconductor junction layer composed of AlN is formed on the surface of the silicon carbide layer, an aluminum film is formed on the surface of the silicon carbide layer by supplying a gaseous raw material containing aluminum and thereafter the aluminum film is nitrified by supplying a gaseous material containing nitrogen to the film, whereby an aluminum nitride layer is formed. Therefore, it is possible to form a Group III nitride semiconductor layer from, for example, AlN whose crystal system is unified into a hexagonal system.

Particularly, according to the present invention, a hydrocarbon gas is blown onto the surface of the substrate composed of a silicon single crystal and hydrocarbon is caused to be adsorbed onto the surface of the silicon single crystal substrate by radiating electrons onto the surface of the silicon single crystal substrate, whereby a cubic silicon carbide layer whose lattice constant exceeds 0.436 nm and is not more than 0.460 nm and which has a nonstoichiometric composition containing silicon abundantly in terms of composition is formed. Therefore, it is possible to stably form a silicon carbide layer that has especially few crystal defects and is excellent in crystallinity and hence it is possible to stably manufacture a high-performance semiconductor device.

Particularly, according to the present invention, after causing a hydrocarbon to be adsorbed onto the surface of the substrate composed of a silicon single crystal by blowing a hydrocarbon gas while radiating electrons, the silicon single crystal substrate is heated to a temperature of not less than a temperature at which hydrocarbon is caused to be adsorbed and a chemical reaction between the silicon forming the substrate and the hydrocarbon adsorbed onto the surface of the substrate is promoted, whereby a cubic silicon carbide layer is formed. Accordingly, it is possible to efficiently form a cubic silicon carbide layer having few crystal defects and, therefore, it is possible to stably manufacture a high-performance semiconductor device.

BEST MODE FOR CARRYING OUT THE INVENTION

Figure 1:
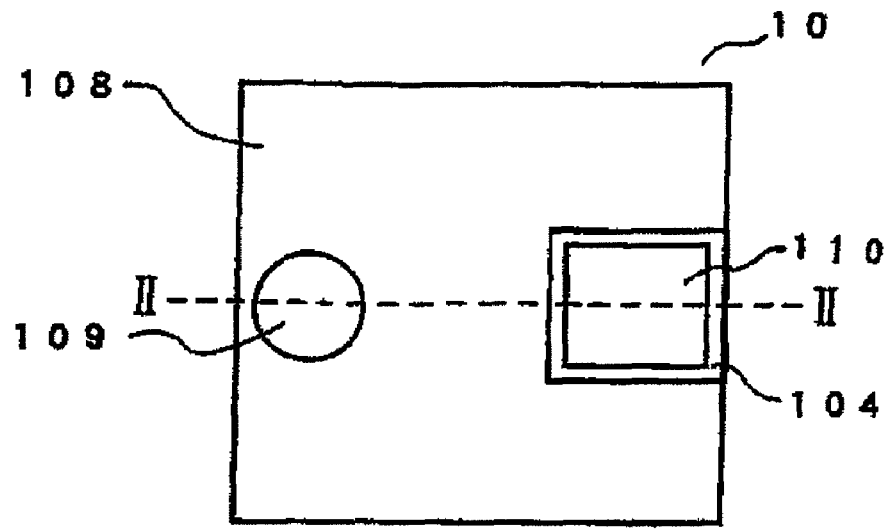
FIG. 1 is a schematic plan view of an LED described in Embodiment 1 of the present invention.

Although it is possible to use silicon single crystals having crystal planes of various kinds of plane directions as silicon single substrates, a silicon crystal that can be most advantageously used as a substrate in carrying out the present invention is a (001) or (111) single crystal whose surface is a (001) crystal plane or a (111) crystal plane. Also a silicon single crystal whose surface is inclined from these crystal planes can be adequately used as a substrate. A silicon single crystal substrate whose surface is inclined from the (001) crystal plane, for example, in the 2°<110> direction in terms of angle, is advantageous for obtaining a crystal layer having few antiphase grain boundaries (hereinafter abbreviated as "APDs") (refer to Materials Science Series "Electronmicroscopy for Crystal—for Materials Researchers" written by Hiroyasu Saka, Nov. 25, 1997, issued by Uchidarokakuho Pub. Co, LTd., first edition, pp. 64 and 65). In the present invention, a (001) silicon single crystal is used mainly for forming a semiconductor device that uses a cubic crystal layer. On the other hand, a (111) silicon single crystal is used mainly for forming a semiconductor device that uses a cubic crystal layer.

The conduction type of a silicon single crystal used as a substrate is not considered. Silicon single crystals of both of the P type and the N type can be used as the substrate. Particularly, silicon single crystal substrates of low resistivity (specific resistance) having high conductivity can be advantageously used for fabricating semiconductor light emitting devices such as LEDs and LDs. High-resistivity silicon single crystals can be used as substrates for semiconductor devices when it is necessary to reduce the leak of current for operating devices (device operating current) to the substrate side. High-resistivity silicon single crystals can be used, for example, as substrates for fabricating FETs (a high-resistivity P type or N type semiconductor may sometimes be referred to as the π type or the ν type, respectively (refer to "Optical Communication Engineering—Light Emitting Device and Photodetector," written by Hiroo Yonezu, May 20, 1995, issued by Kougaku Tosho Co. Ltd., $5^{th}$ edition, p. 317, foot note).

In the present invention, regardless of the plane direction of a crystal plane that forms the surface of a silicon single crystal used as a substrate, a silicon carbide layer is provided on the surface of the silicon single crystal. According to the Ramsdell notation system (refer to "SiC Ceramic New Materials—Recent Developments" written and edited by the $124^{th}$ Committee of High-Temperature Ceramic Materials of Japan Society for the Promotion of Science, Feb. 28, 2001, issued by Uchidarokakuho, first edition, pp. 13 to 16), a cubic crystal layer having a 3C-type crystal structure is most preferable. Whether the crystal structure of silicon carbide layer is a 3C-type cubic silicon carbide (3C—SiC) or, for example, a 4H-type or 6H-type hexagonal silicon carbide (4H—SiC, 6H—SiC) can be judged by an analysis of an electron diffraction pattern, for example.

It is preferred that a 3C—SiC layer be formed by using hydrocarbon caused to be adsorbed on the surface of a silicon single crystal substrate. Examples of hydrocarbon gases for causing hydrocarbon to be adsorbed include saturated aliphatic hydrocarbons, such as methane (molecular formula: $CH_3$), ethane (molecular formula: $C_2H_6$) and propane (molecular formula: $C_3H_8$), and unsaturated hydrocarbons, such as acetylene (molecular formula: $C_2H_2$). In addition, aromatic hydrocarbons or alicyclic hydrocarbons are also available. However, acetylene, which is decomposed and readily reacts with silicon can be most advantageously used. It is preferred that the temperature at which acetylene is caused to be adsorbed onto a (111) crystal plane of a (111) silicon single crystal be in the range from 400° C. to 600° C. The temperature suitable for causing acetylene to be adsorbed onto a (001) crystal plane of a (001) silicon single crystal is higher than in the case of a (111) crystal plane and in the range from 450° C. to 650° C.

It is preferred that hydrocarbons such as acetylene be caused to be adsorbed onto a crystal plane forming the surface of a silicon single crystal substrate after the creation of a reconstruction structure. For example, it is preferred that hydrocarbon be caused to be adsorbed after a 7×7-reconstruction structure is caused to appear on the surface formed from, for example, a (111) silicon single crystal substrate. A 7×7-reconstruction structure can be formed by subjecting the (111) crystal plane forming the surface of, for example, a (111) single crystal to heat treatment in a high-vacuum environment of the order of $10^{-6}$ pascals (pressure unit: Pa), for example, in a molecular beam epitaxial (hereinafter abbreviated as "MBE") growth chamber at 750° C. to 850° C. The reconstruction structure on the surface of a silicon single crystal substrate can be identified by electron diffraction analysis, such as reflection high energy electron diffraction (hereinafter abbreviated as "RHEED").

After hydrocarbon is caused to be adsorbed onto a crystal surface forming the surface of a silicon single crystal substrate, the silicon single crystal substrate is heated, whereby the adsorbed hydrocarbon and the silicon atom forming the substrate crystal are caused to react with each other and a silicon carbide layer is formed. If on this occasion the silicon single crystal substrate is heated at a relatively high temperature, a silicon carbide layer that stoichiometrically contains silicon abundantly can be formed. The silicon single crystal substrate onto which hydrocarbon is caused to be adsorbed is formed by being heated, for example, at 500° C. to 700° C. In proportion as the temperature of this heating becomes higher, a silicon carbide layer which stoichiometrically contains silicon more abundantly can be formed in a short time. The degree to which a silicon carbide layer stoichiometrically contains silicon is reflected in the lattice constant of silicon carbide of a nonstoichiometric composition consisting of the silicon carbide layer. In hydrocarbons of a nonstoichiometric composition, the more abundant the silicon content, the larger the lattice constant. The lattice constant of 3C—SiC of an equivalent composition is 0.43 nm (refer to "SiC Ceramic New Materials—Recent Developments" above, p. 340, Table 5.1.1), whereas a silicon carbide layer of a nonstoichiometric composition related to the present invention is characterized by having lattice constants that exceed 0.436 nm and are not more than 0.460 nm.

A cubic 3C-type silicon carbide layer having a lattice constant in the above-described range has few lattice mismatches with a Group III nitride semiconductor material forming a Group III nitride semiconductor junction layer. Therefore, in forming a Group III nitride semiconductor junction layer from a cubic zincblende crystal type GaN having a lattice constant of, for example, 0.451 nm, a cubic 3C-type silicon carbide layer having a lattice constant in the above-described range is useful as a buffer layer excellent in lattice matching. Also, because the spacing of (110) crystal planes of a cubic 3C-type silicon carbide layer having a lattice constant in the above-described range substantially coincides with the a-axis of wurtzite crystal type hexagonal AlN and, this cubic 3C-type silicon carbide layer is advantageous also for forming a hexagonal Group III nitride semiconductor layer that forms a Group III nitride semiconductor junction layer. Because in a silicon carbide layer having a lattice constant outside of the above-described range, lattice mismatches with Group III nitride semiconductor materials of both cubic and hexagonal crystal forms increase, the crystal quality of a Group III nitride semiconductor junction layer formed on this silicon carbide layer becomes worse remarkably and this is exceedingly disadvantageous.

A silicon carbide layer of a nonstoichiometric composition that contains silicon abundantly compared to carbon can also be formed by causing hydrocarbon to be adsorbed onto the surface of a silicon single crystal substrate and thereafter heating the surface of the substrate by supplying a gas containing silicon to the surface of the substrate. For example, a silicon carbide layer of a nonstoichiometric composition that contains silicon abundantly is formed by heating the surface of a silicon single crystal substrate onto which hydrocarbon is caused to be adsorbed while supplying silanes (molecular formula: $SiH_4$) thereto. Also, a silicon carbide layer of a nonstoichiometric composition that contains silicon abundantly can be formed by heating a silicon single crystal substrate onto which hydrocarbon is caused to be adsorbed while radiating beams of silicon in an MBE growth chamber. The lattice constant of a formed silicon carbide layer of a nonstoichiometric composition can be measured by analysis means, such as an electron diffraction method.

In order to obtain a silicon carbide layer whose surface is a (001) crystal plane in forming a silicon carbide layer of a nonstoichiometric composition, a (001) silicon single crystal whose surface is a (001) crystal plane is used as a substrate. Also, in order to obtain a silicon carbide layer whose surface is a (111) crystal plane in forming a silicon carbide layer of a nonstoichiometric composition, a (111) silicon single crystal whose surface is a (111) crystal plane is used as a substrate.

In forming a silicon carbide layer on the surface of a silicon single crystal substrate regardless of the plane direction of a crystal plane forming the surface, hydrocarbon is caused to be homogeneously adsorbed onto the surface of the substrate by blowing a hydrocarbon gas onto the surface of the substrate while radiating electrons thereto. For example, thermoelectrons emitted from a metal that is electrically heated in a vacuum are used as the electrons to be radiated. Electrons are radiated at a uniform density onto the surface of a silicon single crystal substrate. Appropriate radiation densities range from $1 \times 10^{12}$ to $5 \times 10^{13}$ $cm^{-2}$. If the accelerated energy of electrons to be radiated is as low as less than approximately 100 electron volts (unit: eV), this does not allow hydrocarbon to be uniformly adsorbed onto the surface of a silicon single crystal substrate. On the other hand, if electrons whose accelerated energy exceeds 500 eV are radiated, the decomposition and desorption of hydrocarbon are accelerated and this is disadvantageous. Therefore, it is preferred that the potential difference between an electron source, for example, a tungsten (W) filament and a silicon single crystal substrate, which is an object to be irradiated, be not less than 100 volts (V) but not more than 500 V.

Also in heating a silicon single crystal substrate onto the surface of which hydrocarbon is caused to be adsorbed and thereby forming a 3C—SiC layer on the surface of the substrate, a 3C—SiC layer excellent in crystallinity, which has a low crystal defect density of twins, stacking faults and the like, can be formed by radiating electrons. Appropriate radiation densities range from $1 \times 10^{12}$ to $5 \times 10^{13}$ $cm^{-2}$. Also, 100 eV to 500 eV are appropriate as the accelerated energy of electrons to be radiated.

A Group III nitride semiconductor layer composed of $Al_xGa_yIn_zN_{1-\alpha}M_\alpha$ ($0 \leq X, Y, Z \leq 1$, $X+Y+Z=1$, the symbol M denotes a Group V element except nitrogen and $0 \leq \alpha < 1$) is provided in a silicon carbide layer of a nonstoichiometric composition so as to be bonded thereto. The $Al_xGa_yIn_zN_{1-\alpha}M_\alpha$ that forms a Group III nitride semiconductor junction layer can be formed from, for example, aluminum-gallium nitride ($Al_xGa_yN$: $0 \leq X, Y \leq 1$, $X+Y=1$), gallium-indium nitride ($Ga_yIn_zN$: $0 \leq Y, Z \leq 1$, $Y+Z=1$) and aluminum phosphate nitride ($AlN_{1-\alpha}P_\alpha N$: $0 \leq \alpha \leq 1$).

It is preferred that a Group III nitride semiconductor junction layer be formed from a Group III nitride semiconductor material having a lattice constant or lattice plane spacing that approximates the lattice constant (=a) (that exceeds 0.436 and is not more than 0.460 nm) of a silicon carbide layer of a nonstoichiometric composition. A Group III nitride semiconductor junction layer can be advantageously formed from, for example, cubic zincblende crystal type AlN (a=0.438 nm) and GaN (a=0.451 nm). Also, a Group III nitride semiconductor junction layer can be formed from hexagonal wurtzite crystal type AlN, GaN and a mixed crystal of the two, which have an a-axis approximating the spacing (0.308 nm to 0.325 nm) of (110) crystal planes of a cubic silicon carbide layer having a nonstoichiometric composition related to the present.

In forming a group III nitride semiconductor junction layer composed of hexagonal AlN and the like, it is advisable to use a (111) silicon single crystal whose surface is a (111) crystal plane. Also, in obtaining a group III nitride semiconductor junction layer composed of cubic AlN and the like, it is advantageous to use a (001) silicon single crystal whose surface is a (001) crystal plane.

Furthermore, in forming a group III nitride semiconductor junction layer composed of AlN, it is possible to adopt a method that involves depositing an aluminum (Al) film on the surface of a silicon single crystal substrate and thereafter nitriding the Al film in an atmospheric furnace of a nitrogen-containing gas. According to this forming method, it is possible to efficiently form an AlN layer with a unified crystal system by this forming method. For example, if an Al film is formed on the surface of a (111) silicon single crystal substrate, which is composed of a (111) crystal plane, and thereafter the surface is nitrided in an nitrogen plasma atmosphere, then a hexagonal AlN layer whose crystal system is unified into a hexagonal system can be formed.

A Group III nitride semiconductor junction layer formed with excellent matching on a silicon carbide layer of a nonstoichiometric composition promotes the formation of a superlattice-structured layer provided as an upper layer of the Group III nitride semiconductor junction layer. A Group III nitride semiconductor junction layer can be formed by using growth methods, such as the metal organic chemical vapor deposition (hereinafter abbreviated as "MOCVD") method, the halogen or hydride chemical vapor deposition (CVD) method, the MBE method and the chemical beam epitaxy method (hereinafter abbreviated as "CBE") method.

A superlattice-structured layer constituted by Group III semiconductors is formed on a Group III nitride semiconductor junction layer. A superlattice-structured layer is formed, for example, by alternately stacking III Group nitride semiconductor layers having different compositions of constituent elements. Also, a superlattice-structured layer is formed by alternately stacking Group III nitride semiconductor layers having different band gaps. When a Group III nitride semiconductor junction layer is formed from AlN or GaN, it is preferred that a superlattice-structured layer be constituted by $Al_xGa_{1-x}N$ ($0 \leq X \leq 1$) layers having different aluminum composition ratios (=X) in terms of lattice matching. Also, it is preferred that a superlattice-structured layer be constituted $Ga_QIn_{1-Q}N$ ($0 \leq Q \leq 1$) layers having different gallium (Ga) composition ratios.

Particularly, a superlattice-structured layer that gives a Group III nitride semiconductor layer excellent in surface flatness is obtained by providing an $Al_xGa_{1-x}N$ layer having a minimum aluminum composition ratio among the $Al_xGa_{1-x}N$ layers of different aluminum composition ratios that constitute a superlattice-structured layer so as to be bonded to a Group III nitride semiconductor junction layer. Also similarly, a superlattice-structured layer that gives a Group III nitride semiconductor layer excellent in surface flatness is obtained by providing a $Ga_QIn_{1-Q}$ having a maximum gallium composition ratio among the $Ga_QIn_{1-Q}N$ ($0 \leq Q \leq 1$) layers of different gallium composition ratios that constitute a superlattice-structured layer.

Particularly, the propagation of strains in the interior of a crystal layer can be advantageously suppressed when a superlattice-structured layer is constituted by $Al_xGa_{1-x}N$ layers or $Ga_QIn_{1-Q}N$ layers having a film thickness of not less than 5 MLs but not more than MLs. Therefore, it is possible to form a superlattice-structured layer that brings about the formation of a group III nitride semiconductor layer excellent in surface flatness. A thickness of 1 ML is a thickness of ½ of a c-axis in a hexagonal Group III nitride semiconductor layer. For example, the thickness of 1 ML of a wurtzite crystal type GaN having a c-axis of 0.520 nm is 0.260 nm. This thickness corresponds to a lattice constant in the case of a cubic Group III nitride semiconductor layer.

A superlattice-structured layer may also be of a quantum well structure that gives a quantum level to an electron and a hole. When a quantum-well structure is foamed from $Al_xGa_{1-x}N$ ($0 \leq X \leq 1$) layers, an $Al_xGa_{1-x}N$ ($0 \leq X \leq 1$) layer having a higher aluminum composition ratio (=X) and a larger band gap is used as a barrier layer and an $Al_xGa_{1-x}N$ layer having a lower aluminum composition ratio (=X) and a smaller band gap is used as a well layer. Also, when a quantum well structure is formed from $Ga_QIn_{1-Q}N$ ($0 \leq Q \leq 1$) layers, a $Ga_QIn_{1-Q}N$ layer having a higher gallium composition ratio (=Q) and a larger band gap is used as a barrier layer and having a lower gallium composition ratio (=Q) and a smaller band gap is used as a well layer.

As with the above-described Group III nitride semiconductor junction layer, $Al_xGa_{1-x}N$ layers or $Ga_QIn_{1-Q}N$ layers that constitute a superlattice-structured layer can be formed by using growth methods, such as MOCVD method, halogen or hydride CVD method, MBE method and CBE method. A semiconductor device is readily obtained if a superlattice-structured layer is continuously formed on the Group III nitride semiconductor junction layer by using the same growth method as used in the formation of the above-described Group III nitride semiconductor junction layer.

If in the growth of $Al_xGa_{1-x}N$ or $Ga_QIn_{1-Q}N$ layers that constitute a superlattice-structure, these layers are grown by supplying repeatedly the raw materials of Group III elements and Group V element that constitute these layers, it is possible to obtain a superlattice-structured layer excellent in surface flatness. For example, it is possible to obtain a superlattice-structured layer excellent in surface flatness if $Al_xGa_{1-x}N$ or $Ga_QIn_{1-Q}N$ layers are used which are formed by using a method that involves first supplying the raw materials of the Group III elements, thereafter stopping the supply of the raw materials of the Group III elements, and supplying a nitrogen source in place of the raw materials of the Group III elements, that is, by alternately supplying the raw materials of the Group III elements and the Group V element.

In convenient manufacturing semiconductor devices by using a simple process, it is advisable to perform the cleaning of the surface of a silicon single crystal substrate, the adsorption of hydrocarbon onto the cleaned substrate surface, the formation of a silicon carbide layer using the adsorbed hydrocarbon, the formation of a Group III nitride semiconductor junction layer on the silicon carbide layer, and the formation of a superlattice-structured layer on the Group III nitride semiconductor junction layer by using the same equipment consistently. If the MBE method is adopted, growth is caused to occur in a high-vacuum environment and, therefore, in causing hydrocarbon to be adsorbed and forming a silicon carbide layer on the basis of the adsorbed hydrocarbon, the radiation of electrons onto the surface of a silicon single crystal substrate can be readily performed. Also, the MBE method has the advantage that $Al_xGa_{1-x}N$ layers or $Ga_QIn_{1-Q}N$ layers that constitute a superlattice-structured layer can be readily formed by alternately supplying the raw materials of the constituent elements as described above.

A grown layer excellent in surface flatness can be formed on a superlattice-structured layer. Therefore, if such a grown layer excellent in surface roughness is used as an active layer, it is possible to form a semiconductor device having excellent optical or electrical properties. A high-mobility FET can be formed if, for example, a hexagonal Group III nitride semiconductor layer provided in a superlattice-structured layer constituted by hexagonal Group III nitride semiconductor layers on a hexagonal Group III nitride semiconductor junction layer is utilized as an electron channel layer or an electron supply layer. Particularly, it is possible to manufacture a high-mobility FET having an electron channel layer that efficiently accumulates two-dimensional electrons due to the occurrence of the piezoelectric effect caused by a hexagonal Group III nitride semiconductor.

Also, it is possible to form high-luminance light emitting devices, such as LEDs, if for example a cubic Group III nitride semiconductor layer provided in a superlattice-structured layer constituted by cubic Group III nitride semiconductor layers on a cubic Group III nitride semiconductor junction layer is utilized as a lower cladding layer or a light limiting layer. Particularly, an LD with a unified oscillation wavelength can be formed by utilizing the properties of a cubic Group III nitride semiconductor with a degenerated valence band.

Next, embodiments of the present invention will be described. The present invention, however, is not limited by these embodiments.

EMBODIMENT 1

In Embodiment 1, the present invention will be described in detail by taking, as an example, a case where a light emitting diode (LED) is fabricated from an epitaxially stacked structure including a silicon carbide layer of a nonstoichiometric composition provided on a (111) silicon single crystal substrate whose surface is a (111) crystal plane, a hexagonal Group III nitride semiconductor junction layer, a superlattice-structured layer constituted by hexagonal Group III nitride semiconductor layers.

Figure 2:
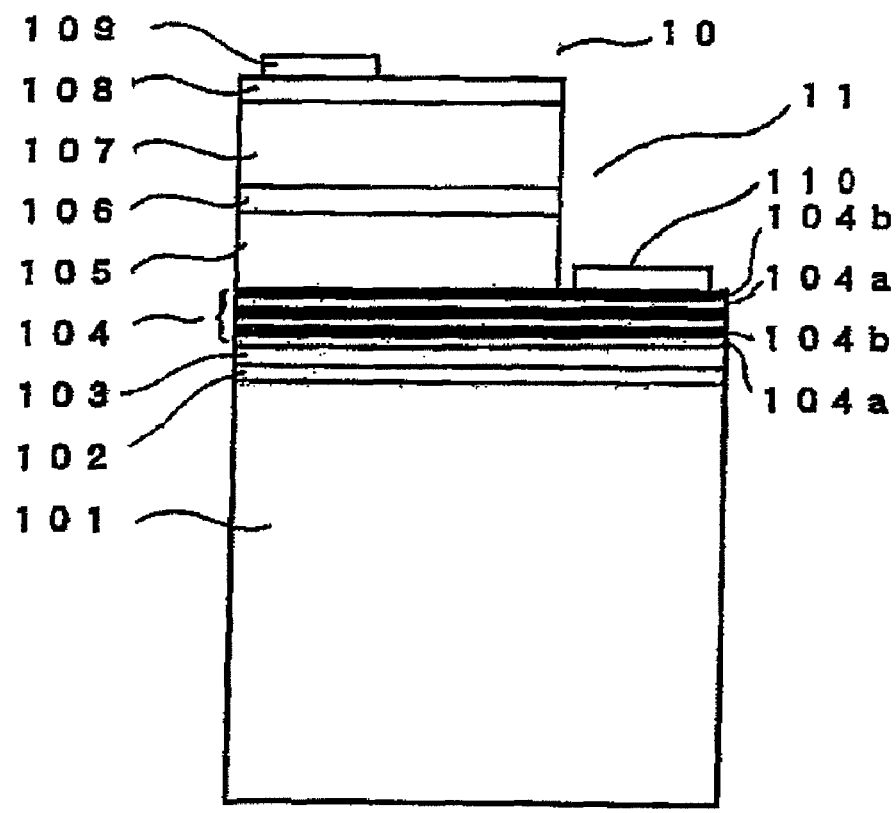
FIG. 2 is a schematic diagram showing a sectional structure taken along the broken line II-II of the LED shown in FIG. 1.
Figure 3:
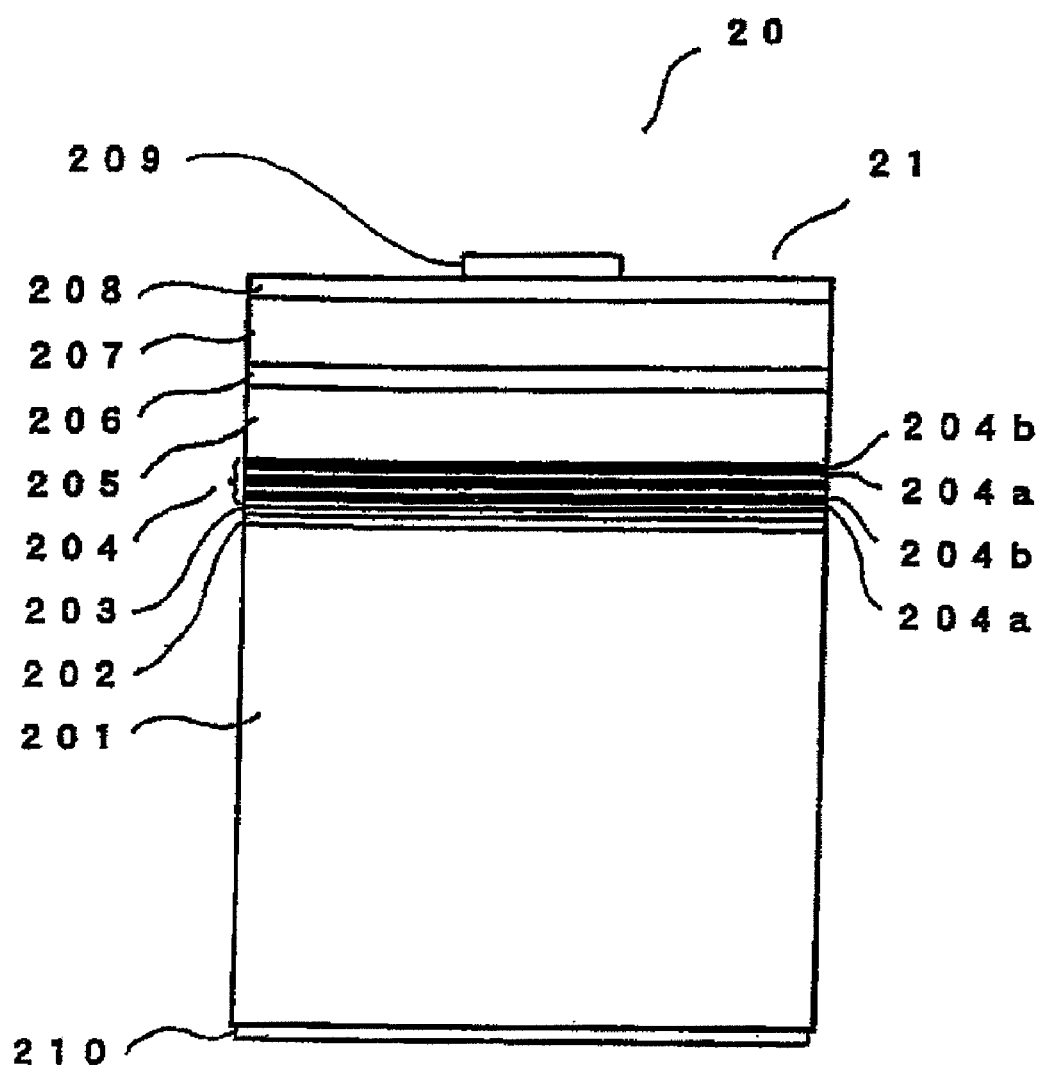
FIG. 3 is a schematic sectional view of an LED described in Embodiment 2 of the present invention.

The plane structure of a semiconductor LED 10 fabricated in Embodiment 1 is schematically shown in FIG. 1. The sectional structure of the LED 10 of FIG. 10 taken along the broken line II-II is schematically shown in FIG. 2.

In the fabrication of the LED 10, a P type silicon single crystal having a (111) crystal plane as the surface, to which boron (element symbol: B) is added, was used as a substrate 101. After the substrate 101 was transported into a growth chamber for MBE growth, the substrate 101 was heated to 850° C. in a high vacuum of approximately $5 \times 10^{-7}$ pascals (Pa). Heating at the same temperature was continued while an RHEED pattern was being monitored until the (111) crystal plane forming the surface of the substrate 101 obtained a 7×7-reconstruction structure.

After the appearance of the 7×7-rearranged structure was ascertained, the temperature was lowered to 450° C., with the substrate 101 kept in the MBE growth chamber. Next, an acetylene gas was blown onto the surface of the substrate 101 and acetylene was caused to be adsorbed onto the surface. The acetylene gas was continuously blown until an electron diffraction spot originated from the 7×7-reconstruction structure of the surface of the substrate 101 almost disappeared on the RHEED pattern.

After that, the blowing of the acetylene gas onto the surface of the substrate 101 was stopped and the substrate 101 was heated to 600° C. Until a streak due to the cubic 3C-type silicon carbide appeared on the RHEED pattern, the substrate 101 was held at the same temperature and a silicon carbide layer 102 was formed on the surface of the silicon single crystal substrate 101. At 600° C., the lattice constant of the formed silicon carbide was calculated to be 0.450 nm on the basis of the lattice constant of the silicon single crystal found from the RHEED pattern of the (111) silicon single crystal. The layer thickness of the silicon carbide layer 102 was approximately 2 nm and the surface of the layer 102 was a (111) crystal plane.

On the silicon carbide layer 102 of a nonstoichiometric composition, a wurtzite crystal type hexagonal aluminum nitride (AlN) layer 103 was formed by the MBE method using a nitrogen plasma as a nitrogen source, with the temperature of the substrate 101 raised to 700° C. The nitrogen plasma was generated by using an electron cyclotron resonance (ECR) type apparatus that applies a high-frequency wave with a frequency of 13.56 MHz and a magnetic field to a high-purity nitrogen gas. With the MBE growth chamber kept at a high vacuum of approximately $1 \times 10^{-6}$ Pa, the atomic nitrogen (nitrogen radical) within the nitrogen plasma was extracted by using an electrical repulsive force and sputtered onto the surface of the silicon carbide layer 102. The layer thickness of the AlN layer 103 formed as a Group III nitride semiconductor junction layer mentioned in the present invention was approximately 15 nm and the surface of the AlN layer 103 was a (0001) crystal plane.

On the hexagonal AlN layer 103, a first N type hexagonal gallium nitride (GaN) 104a was formed at 720° C. by the MBE method. The layer thickness of the first N type GaN layer 104a, which is a constituent layer of a superlattice-structured layer 104, was set at 10 ML (approximately 2.6 nm). A first N type aluminum gallium nitride mixed crystal ($Al_{0.10}Ga_{0.90}N$) 104b with an aluminum (Al) composition ratio of 0.10, which is another constituent layer constituting the superlattice-structured layer 104, was provided so as to be bonded to the first N type GaN layer 104a. Next, a second N type GaN layer 104a was provided so as to be bonded to the first N type $Al_{0.10}Ga_{0.9}N$ mixed crystal layer 104b. A second N type $Al_{0.10}Ga_{0.90}N$ mixed crystal layer 104b was provided so as to be bonded to the second N type GaN layer 104a. Furthermore, on the second N type $Al_{0.10}Ga_{0.90}N$ mixed crystal layer 104b, a third N type GaN layer 104a and a third N type $Al_{0.10}Ga_{0.90}N$ mixed crystal layer 104b were provided, whereby the formation of the superlattice-structured layer 104 was completed. The layer thickness of all of the first to third N type $Al_{0.10}Ga_{0.90}N$ mixed crystal layers 104b was set at 10 ML.

On the superlattice-structured layer 104, a lower cladding layer 105 composed of N type GaN with a layer thickness of approximately 2200 nm was provided by the MBE method while silicon (Si) was being doped. Because the N type GaN layer 105 was provided via the above-described superlattice-structured layer 104, the N type GaN layer 105 had excellent flatness with roughness of approximately 1.0 nm in terms of the RMS-value.

On the lower cladding layer 105, a light emitting layer 106 of a multi-quantum well structure obtained by alternately stacking an N type GaN as a buffer layer and an N type gallium-indium nitride mixed crystal ($Ga_{0.85}In_{0.15}N$) as a well on five cycles was formed. On the light emitting layer 106, an upper cladding layer 107 composed of P type $Al_{0.10}Ga_{0.90}N$ (layer thickness: approximately 90 nm) was formed. As a result, a light emitting part of a PN junction type double-hetero (DH) junction structure was constituted by the N type cladding layer 105, the N type light emitting layer 106 and the P type upper cladding layer 107. On the P type upper cladding layer 107 that forms the light emitting part, a contact layer 108 composed of P type GaN (layer thickness: approximately 100 nm) was further provided, whereby a stacked structure 11 for the LED 10 was formed.

On the surface of the P type contact layer 108 forming the uppermost surface of the stacked structure 11, a P type ohmic electrode 109 composed of gold (element symbol: Au) and a nickel (element symbol: Ni) oxide was formed. An N type ohmic electrode 110 was formed after the removal of the light emitting layer 106, the upper cladding layer 107 and the contact layer 108, which were present in the region where the electrode 110 was to be provided, by use of general dry etching means. Because the N type ohmic electrode 110 was formed via the superlattice-structured layer 104, the N type ohmic electrode 110 was provided on the lower cladding layer 105, which obtained excellent flatness. That is, in the LED 10, the P type ohmic electrode 109 and the N type ohmic electrode were provided on the same front surface side with respect to the silicon single crystal substrate 101.

An device operating current was flown across the P type and N type ohmic electrodes 109, 110 of the LED chip fabricated as described above, and luminescent and electrical properties were investigated. When a current was flown through the LED 10 in the forward direction, blue light having a dominant wavelength of 460 nm was emitted. The luminescence intensity obtained when the forward-direction current was 20 mA, was as high as approximately 2.2 mW. The forward-direction voltage (Vf) obtained when a current of 20 mA was caused to flow in the forward direction, became approximately 3.4 V. Because the silicon carbide layer 102 of a nonstoichiometric composition was provided as the buffer layer, it was possible to provide the superlattice-structured layer 104 and the light emitting part having the DH structure, which were formed from Group III semiconductor layers excellent in crystallinity, on the silicon carbide layer 102. For this reason, the reverse-direction voltage obtained when a reverse-direction current was set to 10 μA, became as high as 15 V. Also, because particularly the superlattice-structured layer 104 and the light emitting part were constituted by Group III semiconductor layers excellent in crystallinity, it was possible to obtain an LED excellent in reverse-direction breakdown voltage properties, which is substantially free from local breakdowns.

EMBODIMENT 2

In Embodiment 2, the present invention will be described in detail by taking, as an example, a case where a light emitting diode (LED) is fabricated from an epitaxially stacked structure including a silicon carbide layer of a nonstoichiometric composition provided on a (001) silicon single crystal substrate whose surface is a (001) crystal plane, a cubic Group III nitride semiconductor junction layer, a superlattice-structured layer constituted by cubic Group III nitride semiconductor layers.

The planar structure of a semiconductor LED 10 fabricated in Embodiment 2 is schematically shown in FIG. 2.

In the fabrication of the LED 20, an N type silicon single crystal having a (001) crystal plane as the surface, to which phosphorus (element symbol: P) is added, was used as a substrate 201. After the substrate 201 was transported into a growth chamber for MBE growth, the substrate 201 was heated to 800° C. in a high vacuum of approximately $5\times10^{-7}$ pascals (Pa). Heating at the same temperature was continued while an RHEED pattern was being monitored until the (001) crystal plane forming the surface of the substrate 201 obtained a 2×1-reconstructed structure.

After the appearance of the 2×2-reconstructed structure was ascertained, the temperature was lowered to 420° C., with the substrate 201 kept in the MBE growth chamber. Next, an acetylene gas was blown onto the surface of the substrate 201 while electrons were being radiated, and acetylene was caused to be adsorbed onto the surface. The electrons were generated by electric heating of tungsten (element symbol: W) arranged in the growth chamber maintained in a vacuum. The electrons were radiated at an accelerated voltage of 300 V and with an area density of approximately $5\times10^{12}$ cm$^{-2}$. The acetylene gas and electrons were continuously supplied until an electron diffraction spot caused by the 2×1-reconstruction structure of the surface of the substrate 201 almost disappeared on the RHEED pattern.

After that, the silicon single crystal substrate 201 was heated to 550° C. When the temperature of the substrate 201 became stable at 550° C., electrons started to be radiated again onto the substrate 201. Until a streak due to the cubic 3C-type silicon carbide appeared on the RHEED pattern, the radiation of electrons onto the surface of the substrate 201 was continued, whereby a 3C-type cubic silicon carbide layer 202 was formed on the surface of the silicon single crystal substrate 201. At 600° C., the lattice constant of the formed silicon carbide was calculated to be 0.440 nm on the basis of the lattice constant of the silicon single crystal found from the RHEED pattern of the (001) silicon single crystal. No extra diffraction caused by twins and stacking faults was observed in the RHEED pattern of the silicon carbide layer 202. The layer thickness of the silicon carbide layer 202 was approximately 2 nm and the surface of the layer 202 was a (001) crystal plane.

On the silicon carbide layer 202 of a nonstoichiometric composition, a cubic zinc blende crystal type aluminum nitride (AlN) layer 203 was formed by the MBE method using a nitrogen plasma as a nitrogen source, with the temperature of the substrate 201 raised to 700° C. The nitrogen plasma was generated by using an electron cyclotron resonance (ECR) type apparatus that applies a high-frequency wave with a frequency of 13.56 MHz and a magnetic field to a high-purity nitrogen gas. With the MBE growth chamber kept in a high vacuum of approximately $1\times10^{-6}$ Pa, the atomic nitrogen (nitrogen radical) within the nitrogen plasma was extracted by using an electrical repulsive force and sputtered onto the surface of the silicon carbide layer 202. The layer thickness of the AlN layer 203 formed as a Group III nitride semiconductor junction layer mentioned in the present invention was set at approximately 8 nm and the surface of the AlN layer 203 was a single crystal layer whose surface is a (001) crystal plane.

On the (001) crystal plane of the surface of the cubic AlN layer 203, a first N type cubic gallium nitride (GaN) 204a was formed at 700° C. by the MBE method. The layer thickness of the first N type GaN layer 204a, which is a constituent layer of a superlattice-structured layer 204, was set at 15 ML (approximately 3.9 nm). A first N type gallium indium nitride mixed crystal ($Ga_{0.95}In_{0.05}N$) 204b with a gallium (Ga) composition ratio of 0.95, which is another constituent layer constituting the superlattice-structured layer 204, was provided so as to be bonded to the first N type GaN layer 204a. Next, a second N type GaN layer 204a was provided so as to be bonded to the first N type $Ga_{0.95}In_{0.05}N$ mixed crystal layer 204b. A second $Ga_{0.95}In_{0.05}N$ mixed crystal layer 204b was provided so as to be bonded to the second N type GaN layer 204a. Furthermore, on the second $Ga_{0.95}In_{0.05}N$ mixed crystal layer 204b, a third N type GaN layer 204a and a third N type $Ga_{0.95}In_{0.05}N$ mixed crystal layer 204b were provided, whereby the formation of the superlattice-structured layer 204 was completed. The layer thickness of all of the first to third N type $Ga_{0.95}In_{0.05}N$ mixed crystal layers 204b was set at 10 ML.

On the second $Ga_{0.95}In_{0.05}N$ mixed crystal layer 204b whose surface is a (001) crystal plane, which forms the uppermost surface of the superlattice-structured layer 204, a lower cladding layer 205 formed from N type cubic GaN with a layer thickness of approximately 1800 nm was provided by the MBE method while silicon was being doped. Because the N type GaN layer 205 was provided via the above-described superlattice-structured layer 204, the N type GaN layer 205 had good flatness with surface roughness of approximately 1.2 nm in terms of RMS.

On the lower cladding layer 205, a light emitting layer 206 of a multi-quantum well structure constituted by five pairs of cubic N type GaN barrier layers and cubic N type gallium indium nitride mixed crystals ($Ga_{0.85}In_{0.15}N$) well layers were formed at 700° C. by the MBE method. On the light emitting layer 206, an upper cladding layer 207 composed of cubic P type $Al_{0.10}Ga_{0.90}N$ was formed. As a result, a light emitting part of a PN junction type double-hetero (DH) junction structure was constituted by the N type cladding layer 205, the N type light emitting layer 206 and the P type upper cladding layer 207. On the P type upper cladding layer 207 that forms the light emitting part, a contact layer 208 composed of cubic P type GaN with a layer thickness of approximately 90 nm was further provided by the MBE method, whereby a stacked structure 21 for the LED 20 was formed.

In the middle of the surface of the P type contact layer 208 forming the uppermost surface of the stacked structure 21, a P type ohmic electrode 209 composed of gold (Au) and an nickel (Ni) oxide was formed. An N type ohmic electrode 210 was formed by providing a gold vacuum evaporated film on the whole area of the rear surface of the N type silicon single crystal substrate 201.

A device operating current was caused to flow across the P type and N type ohmic electrodes 209, 210 of the LED chip 20 fabricated as described above, and luminescent and electrical properties were investigated. When a current was flown through the LED 20 in the forward direction, blue light having a dominant wavelength of 465 nm was emitted. The luminescence intensity obtained when the forward-direction current was 20 mA, was as high as approximately 2.0 mW. The forward-direction voltage (Vf) obtained when a current of 20 mA was flown in the forward direction became approximately 3.3 V. Because the silicon carbide layer 202 of a nonstoichiometric composition was provided as the buffer layer, it was possible to provide the superlattice-structured layer 204 and the light emitting part having the DH structure, which were composed of Group III semiconductor layers excellent in crystallinity, on the silicon carbide layer 202. For this reason, the reverse-direction voltage obtained when a reverse-direction current was 10 µA, became as high as 15 V. Also, because particularly the superlattice-structured layer 204 and the light emitting part were constituted by Group III nitride semiconductor layers excellent in crystallinity, it was possible to obtain an LED excellent in reverse-direction breakdown voltage properties, which is substantially free from local breakdowns.

EMBODIMENT 3

The present invention in this embodiment will be concretely described by taking, as an example, a case where an LED having a Group III nitride semiconductor junction layer composed of aluminum nitride formed by nitriding a metal aluminum film is fabricated.

As described in Embodiment 1 above, a cubic 3C-type silicon carbide layer was formed on a (111) silicon single crystal substrate whose surface is a (111) crystal plane. Next, within an MBE growth chamber, aluminum (Al) beams were radiated onto the surface formed from a (111) crystal plane of the silicon carbide layer having a lattice constant of 0.450 nm, whereby an Al film was formed. The film thickness of the Al film was set at approximately 3 nm.

Next, by use of an ECR (electron cyclotron resonance) type radio-frequency (RF) plasma generator provided in the MBE growth chamber, a nitrogen plasma was generated within the chamber. After that, nitrogen radicals in the nitrogen plasma were selectively extracted and radiated onto the above-described Al film, which was nitrided thereby. It was ascertained from an RHEED pattern that the AlN film formed by nitriding is composed of a hexagonal crystal.

With the hexagonal AlN layer formed by nitriding the Al film serving as a Group III nitride semiconductor junction layer, a superlattice-structured layer, an N type lower cladding layer, an N type light emitting layer, a P type upper cladding layer and a P type contact layer of exactly the same configuration as described in Embodiment 1 above were stacked in order, whereby a stacked structure for LED was formed. By using the AlN layer formed by nitriding as the Group III nitride semiconductor junction layer, all of the Group III nitride semiconductor layers constituting the above-described superlattice-structured layer and the like provided on the AlN layer were unified into a hexagonal system. According to an electron diffraction analysis and a general cross-sectional TEM (transmission electron microscope) observation, the surfaces of these layers were (0001) crystal planes and the presence of cubic crystalline granules was scarcely observed.

On the above-described stacked structure having the hexagonal AlN layer formed by nitriding as the group III nitride semiconductor junction layer, P type and N type ohmic electrodes were provided as described in Embodiment 1 above and an LED was formed thereby.

The luminescence wavelength observed when a forward-direction current was flown through the LED, was approximately 460 nm, almost the same value as with the LED described in Embodiment 1 above. Furthermore, because the AlN layer that was formed by the nitriding of the Al film and whose crystal system was unified into a hexagonal system, was used as the Group III nitride semiconductor junction layer, the light emitting layer was formed from hexagonal Group III nitride semiconductor crystals substantially free from the mixing of cubic crystalline granules. Therefore, the luminescence wavelength between LED chips was uniform.

In the semiconductor device of the present invention, a silicon single crystal is used as a substrate, and a buffer layer is formed from cubic silicon carbide which is provided on the substrate, whose lattice constant exceeds 0.436 nm and is not more than 0.460 nm, and which has a nonstoichiometric composition containing silicon abundantly in terms of composition, a Group III nitride semiconductor junction layer composed of $Al_xGa_yIn_zN_{1-\alpha}M_\alpha$ is provided on the buffer layer, and a superlattice-structure constituted by Group III nitride semiconductors is provided on the Group III nitride semiconductor junction layer. The semiconductor device is obtained by using this stacked structure. Therefore, it is possible to form a Group III nitride semiconductor layer excellent in crystallinity and in surface flatness as well. Therefore, a high-performance semiconductor device is obtained.

The invention claimed is:

1. A semiconductor device comprising a silicon single crystal substrate, a silicon carbide layer provided on a surface of the substrate, a Group III nitride semiconductor junction layer provided in contact with the silicon carbide layer, and a superlattice-structured layer constituted by Group III nitride semiconductors on the Group III nitride semiconductor junction layer, wherein the silicon carbide layer is a layer of a cubic system whose lattice constant exceeds 0.436 nm and is not more than 0.460 nm and which has a nonstoichiometric composition containing silicon abundantly in terms of composition, and the Group III nitride semiconductor junction layer has a composition of $Al_xGa_yIn_zN_{1-\alpha}M_\alpha$ ($0 \leq X, Y, Z \leq 1$, $X+Y+Z=1$, $0 \leq \alpha < 1$, M is a Group V element except nitrogen).

2. The semiconductor device according to claim 1, wherein the superlattice-structured layer constituted by Group III nitride semiconductors is a layer formed by alternately stacking aluminum gallium nitride ($Al_xGa_{1-x}N$: $0 \leq X \leq 1$) layers having different aluminum (Al) composition ratios.

3. The semiconductor device according to claim 2, wherein a layer having a low Al composition ratio among the aluminum-gallium nitride layers having different aluminum composition ratios is in contact with the Group III nitride semiconductor junction layer.

4. The semiconductor device according to claim 1, wherein the superlattice-structured layer constituted by Group III nitride semiconductors is a layer formed by alternately stacking gallium indium nitride ($Ga_QIn_{1-Q}N$: $0 \leq Q \leq 1$) layers having different gallium (Ga) composition ratios.

5. The semiconductor device according to claim 4, wherein a layer having a high gallium (Ga) composition ratio among the gallium indium nitride layers having different gallium (Ga) composition ratios is in contact with the Group III nitride semiconductor junction layer.

6. The semiconductor device according to claim 1, wherein the superlattice-structured layer constituted by Group III nitride semiconductors has a film thickness in the range from 5 monolayers (MLs) to 30 MLs.

7. The semiconductor device according to claim 1, wherein the silicon single crystal substrate is a substrate whose surface is a (111) crystal plane, and the Group III nitride semiconductor junction layer is a hexagonal wurtzite crystal type aluminum nitride (AlN) layer.

8. The semiconductor device according to claim 1, wherein the silicon single crystal substrate is a substrate whose surface is a (001) crystal plane, and the Group III nitride semiconductor junction layer is a cubic zinc blende crystal type aluminum nitride (AlN) layer.

* * * * *